United States Patent
Tak et al.

(10) Patent No.: US 6,819,399 B2
(45) Date of Patent: Nov. 16, 2004

(54) EXPOSURE MASK FOR FABRICATING LIQUID CRYSTAL DISPLAY AND METHOD FOR EXPOSING SUBSTRATE IN FABRICATING LIQUID CRYSTAL DISPLAY USING THE MASK

(75) Inventors: Young-Mi Tak, Seoul (KR); Woon-Yong Park, Suwon (KR); Mun-Pyo Hong, Seongnam (KR); Jung-Ho Lee, Suwon (KR)

(73) Assignee: Samsung Electronics Co., Ltd. (KR)

(*) Notice: Subject to any disclaimer, the term of this patent is extended or adjusted under 35 U.S.C. 154(b) by 0 days.

(21) Appl. No.: 10/399,799

(22) PCT Filed: Mar. 4, 2002

(86) PCT No.: PCT/KR02/00367
§ 371 (c)(1),
(2), (4) Date: Apr. 22, 2003

(87) PCT Pub. No.: WO03/019272
PCT Pub. Date: Mar. 6, 2003

(65) Prior Publication Data
US 2004/0021801 A1 Feb. 5, 2004

(30) Foreign Application Priority Data
Aug. 27, 2001 (KR) .................... 2001-51818
Sep. 11, 2001 (KR) .................... 2001-55712

(51) Int. Cl.$^7$ .................... G03B 27/42; G01B 11/00
(52) U.S. Cl. .................... 355/53; 356/401
(58) Field of Search .................... 355/53, 72, 75; 430/5, 22; 356/400, 401

(56) References Cited

U.S. PATENT DOCUMENTS

| | | | | | |
|---|---|---|---|---|---|
| 5,134,058 A | * | 7/1992 | Han | ............ | 430/327 |
| 5,413,898 A | * | 5/1995 | Kim et al. | ............ | 430/325 |
| 5,742,362 A | * | 4/1998 | Chikamichi | ............ | 349/2 |
| 5,895,741 A | * | 4/1999 | Hasegawa et al. | ............ | 430/5 |
| 5,976,738 A | * | 11/1999 | Nakashima | ............ | 430/22 |
| 6,238,851 B1 | * | 5/2001 | Nishi | ............ | 430/394 |
| 6,331,885 B1 | * | 12/2001 | Nishi | ............ | 355/53 |
| 2001/0031406 A1 | * | 10/2001 | Masuyuki | ............ | 430/22 |
| 2001/0033976 A1 | * | 10/2001 | Soenosawa | ............ | 430/5 |

FOREIGN PATENT DOCUMENTS

| JP | 63-77028 | * | 4/1988 |
|---|---|---|---|
| JP | 11-163354 | * | 6/1999 |
| JP | 11-176726 | * | 7/1999 |

* cited by examiner

*Primary Examiner*—Alan Mathews
(74) *Attorney, Agent, or Firm*—F. Chau & Associates, LLC

(57) ABSTRACT

A mask for fabricating a liquid crystal display with a substrate includes a first mask pattern placed at the center of the substrate with the center line to expose the center of the substrate to light. A second mask pattern is placed to the left of the first mask pattern to expose the left side of the substrate to light. The second mask pattern is spaced apart from the first mask pattern with a first distance. A third mask pattern is placed to the right of the first mask pattern to expose the right side of the substrate to light. The third mask pattern is spaced apart from the first mask pattern with a second distance.

15 Claims, 5 Drawing Sheets

EXPOSURE MASK FOR FABRICATING LIQUID CRYSTAL DISPLAY AND METHOD FOR EXPOSING SUBSTRATE IN FABRICATING LIQUID CRYSTAL DISPLAY USING THE MASK

BACKGROUND OF THE INVENTION (a) Field of the Invention

The present invention relates to a mask for fabricating a liquid crystal display, and a method of exposing a substrate for a liquid crystal display to light using the mask.

(b) Description of the Related Art

Generally, a liquid crystal display has two substrates with electrodes, and a liquid crystal layer sandwiched between the two substrates. Voltages are applied to the electrodes so that the liquid crystal molecules in the liquid crystal layer are re-oriented to thereby control the light transmission. The electrodes may be all formed at one of the substrates.

In order to form various kinds of patterns at the substrate, photolithography is made with respect to the substrate while involving the step of light exposing.

Conventionally, a stepper or an aligner is used for the light exposing purpose.

In the case of use of the stepper, a mini-sized mask is introduced. The substrate is partitioned into several shot regions, and exposed to light while moving the stepper mask over the substrate in voluntary directions. The stepper mask and the substrate are mounted at the stepper such that they are aligned with each other in an appropriate manner.

In the case of use of the aligner, a large-sized mask is introduced such that the entire area of the substrate is exposed to light only with one shot. The aligner mask is first mounted at the aligner, and the substrate is then aligned with the aligner mask. The aligner is preferably used in fabricating the liquid crystal display.

However, the use of the aligner involves the following problem. As the size of the substrate becomes enlarged to be larger than the existent aligner, it cannot be exposed to light through one mask with one shot. Accordingly, stitch failure is liable to be made at the resulting display device. Therefore, it is required that a new typed light exposing device or design technique should be developed. For instance, such a technique may be made with respect to the inter-shot alignment in the process of exposing the large-sized substrate to light.

SUMMARY OF THE INVENTION

It is an object of the present invention to provide a mask for fabricating a liquid crystal display which makes the correct inter-shot alignment with the large-sized substrate while preventing the stitch failure.

This and other objects may be achieved by a mask with different mask patterns for making shots in a separate manner. A large-sized substrate is exposed to light using such a mask.

Specifically, the mask for fabricating a liquid crystal display with a substrate includes a first mask pattern placed at the center of the substrate with the center line to expose the center of the substrate to light. A second mask pattern is placed to the left of the first mask pattern to expose the left side of the substrate to light. The second mask pattern is spaced apart from the first mask pattern with a first distance. A third mask pattern is placed to the right of the first mask pattern to expose the right side of the substrate to light. The third mask pattern is spaced apart from the first mask pattern with a second distance.

Alignment keys for the light exposing are formed at the first mask pattern. The alignment keys are formed with a pair of first alignment patterns placed to the left and to the right of the center line of the mask symmetrical to each other with respect to the center line of the mask, a pair of second alignment patterns placed to the right of the first alignment patterns while being spaced apart from the first alignment patterns with the first distance, and a pair of third alignment patterns placed to the left of the first alignment patterns while being spaced apart from the first alignment patterns with the second distance.

In a method of exposing a substrate for a liquid crystal display to light, a substrate partitioned with a center portion, a left portion and a right portion is first prepared. A mask with first to third mask patterns is also prepared. The first mask pattern is-placed at the center of the substrate with the center line to expose the center portion of the substrate to light. The second mask pattern is placed to the left of the first mask pattern to expose the left side of the substrate to light while being spaced apart from the left side of the first mask pattern with a first distance. The third mask pattern is placed to the right of the first mask pattern to expose the right side of the substrate to light while being spaced apart from the right side of the first mask pattern with a second distance. The mask and the substrate are then aligned with each other. Thereafter, the light exposing with respect to the center portion, the left portion and the right portion of the substrate are made using the mask in a separate manner.

First alignment keys are formed at the first mask pattern of the mask, and second alignment keys are formed at the center portion of the substrate such that the second alignment keys match to the first alignment keys. The first alignment keys are formed with a pair of first alignment patterns placed to the left and to the right of the center line of the mask symmetrical to each other with respect to the center line of the mask, a pair of second alignment patterns placed to the right of the first alignment patterns while being spaced apart from the first alignment patterns with the first distance, and a pair of third alignment patterns placed to the left of the first alignment patterns while being spaced apart from the first alignment patterns with the second distance.

The alignment of the mask with the substrate is made through combining the first alignment keys of the first mask pattern with the second alignment keys of the substrate, and the light exposing with respect to the center portion of the substrate is made using the first mask pattern. At this time, the light exposing with respect to the substrate using the mask is made while intercepting the mask and the substrate with a light interception member of a light exposing device except for the first mask pattern.

The alignment of the mask with the substrate is made through combining the first alignment patterns of the first mask pattern with the second alignment patterns of the substrate, and the light exposing with respect to the left portion of the substrate is made using the second mask pattern. At this time, the light exposing with respect to the substrate using the mask is made while intercepting the mask and the substrate with a light interception member of a light exposing device except for the second mask pattern.

The alignment of the mask with the substrate is made through combining the first alignment patterns of the first mask pattern with the third alignment patterns of the substrate, and the light exposing with respect to the right portion of the substrate is made using the third mask pattern. At this time, the light exposing with respect to the substrate using the mask is made while intercepting the mask and the substrate with a light interception member of a light exposing device except for the third mask pattern.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings in which like reference symbols indicate the same or the similar components, wherein.

DETAILED DESCRIPTION OF THE PREFERRED EMBODIMENTS

Preferred embodiments of this invention will be explained with reference to the accompanying drawings.

As described earlier, in order to form patterns at the large-sized substrate, a partitioned light exposing technique is preferably used because the aligner mask is limited in size.

Figure 1:
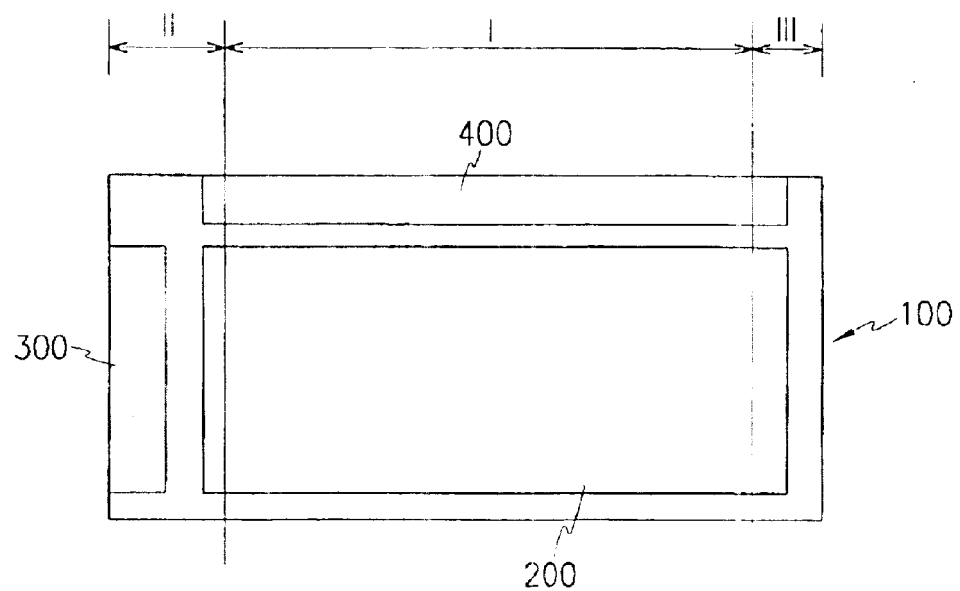
FIG. 1 is a schematic view of a substrate for a liquid crystal display.

FIG. 1 is a schematic view of a substrate for a liquid crystal display. As shown in FIG. 1, the liquid crystal display bears a display region 200 that is a great part of the substrate 100, a gate driving circuit region 300 placed to the left of the display region 200, and a data driving circuit region 400 placed to the right of the display region 200.

A plurality of pixels with the same pattern are arranged at the display region 200 with a matrix form, and a plurality of circuits with the same pattern are repeatedly arranged at the gate driving circuit region 300 and the data driving circuit region 400.

On the basis of the patterns of the liquid crystal display, the light exposing is made with respect to the substrate while defining the shot ranges.

In the light exposing process, as shown in FIG. 1, the substrate 100 is partitioned into a center portion I, a left portion II and a right portion III, and three different mask patterns are introduced at the respective three portions to make the shots. The three mask patterns are formed at one mask. Accordingly, the light exposing with respect to the large-sized substrate 100 is made using only one mask.

Figure 2:
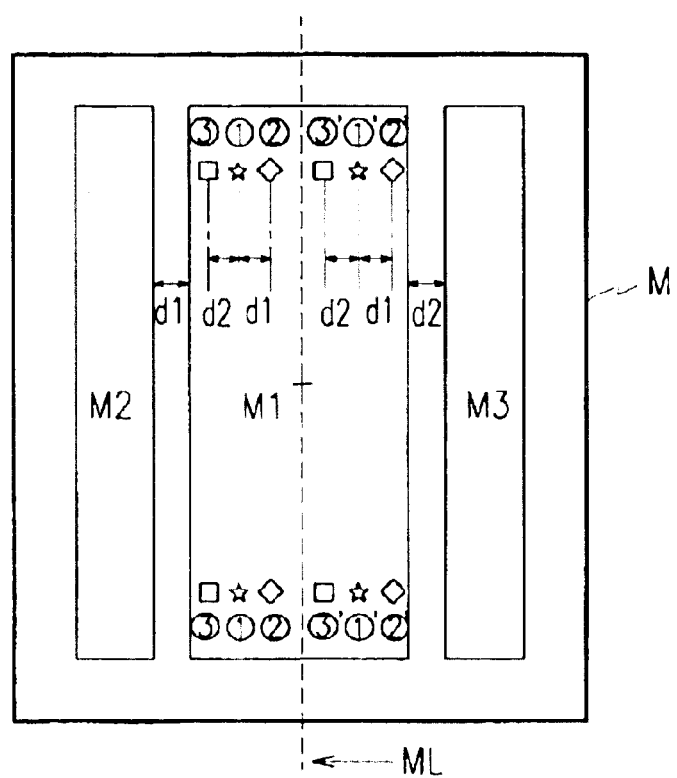
FIG. 2 is a schematic view of a mask for fabricating a liquid crystal display according to a preferred embodiment of the present invention.
Figure 3:
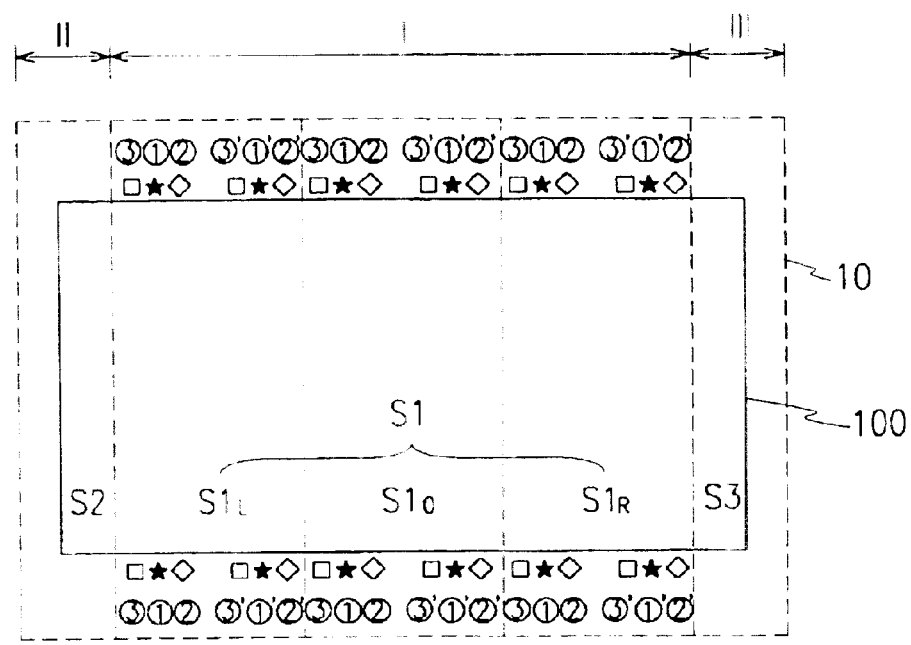
FIG. 3 is a schematic view of a substrate for a liquid crystal display aligned with the mask shown in FIG. 2.

FIG. 2 is a schematic view of a mask for fabricating a liquid crystal display according to a preferred embodiment of the present invention, and FIG. 3 is a schematic view of a substrate for the liquid crystal display aligned with the mask shown in FIG. 2.

For explanatory convenience, the case where the liquid crystal display substrate 100 is formed at one substrate 10 will be illustrated.

As shown in FIG. 3, the substrate 10 is partitioned into a center portion I, a left portion II and a right portions III. The first shot is made with respect to the center portion I using a first mask pattern M1, the second shot is made with respect to the left portion II using a second mask pattern M2, and the third shot is made with respect to the right portion III using a third mask pattern M3. The regions of the substrate 10 exposed to the first to third shots are defined as a first shot region S1, a second shot region S2 and a third shot region S3, respectively.

The first shot is made three times with respect to the center portion I of the substrate 10. That is, a left first shot sub-region $S1_L$, a center first shot sub-region $S1_O$ and a right first shot sub-region $S1_R$ are existent at the first shot region S1.

As shown in FIG. 2, the first to third mask patterns M1, M2 and M3 are formed at one mask M. As the second and the third mask patterns M2 and M3 are formed with the same dimension as the second and the third shot regions S2 and S3, the second and the right portions II and III of the substrate 10 can be patterned through making only one shot.

As the first mask pattern M1 has an area smaller than the center portion I of the substrate 10, the shot with respect to the center portion I using the first mask pattern M1 is made two times or more. It is preferable that the width of the first mask pattern M1 should be established to be in constant proportion to the width of the center portion I. In this preferred embodiment, the first shot with respect to the center portion I is made three times.

The first mask pattern M1 for patterning the center portion I of the substrate 10 is formed at the center of the mask M such that it involves the center line ML of the mask M. The second mask pattern M2 for patterning the left portion II of the substrate 10 is placed to the left of the first mask pattern M1 such that it is spaced apart from the left side of the first mask pattern M1 with a first distance d1. The third mask pattern M3 for patterning the right portion II of the substrate 10 is placed to the right of the first mask pattern M1 such that it is spaced apart from the right side of the first mask pattern M1 with a second distance d2.

In the mask used in the aligner, the alignment keys should be formed symmetrical to each other with respect to the center of the mask. In this preferred embodiment, the alignment keys are formed at the first mask pattern M1 placed at the center of the mask M where the center line ML is existent.

A pair of first alignment key patterns ① and ①' are formed to the left and right of the center line ML of the mask M symmetrical to each other with respect to the center line ML. Furthermore, a pair of second alignment key patterns ② and ②' are formed to the right of the first alignment key patterns ① and ①' while being spaced apart from the first alignment key patterns ① and ①' with the first distance d1. The distance between the first alignment key patterns ① and ①' and the second alignment key patterns ② and ②' is the same as that between the first mask pattern M1 and the second mask pattern M2.

A pair of third alignment key patterns ③ and ③' are formed to the left of the first alignment key patterns ① and ①' while being spaced apart from the first alignment key patterns ① and ①' with the second distance d2. The distance between the first alignment key patterns ① and ①' and the third alignment key patterns ③ and ③' is the same as that between the first mask pattern M1 and the third mask pattern M3.

First to third alignment key patterns ① and ①', ② and ②', and ③ and ③' are also formed at the substrate 10 in the same way as with the mask M. The first to third alignment key patterns ① and ①', ② and ②', and ③ and ③' are formed at the first shot region S1 corresponding to the center portion I of the substrate 10 such that they are standing in the female and male combination relation to the alignment key patterns 1 (and ①', ② and ②', and ③ and ③' of the first mask pattern M1. In the drawings, the respective alignment key patterns are illustrated with different shapes of □, ★ and ◇, but this illustration is made only for the explanatory convenience. That is, the respective patterns may be formed in an arbitrary manner, for instance, with the same shape. The alignment patterns of the mask and the substrate corresponding to each other are formed such that they are standing in the female and male combination relation to each other.

A method of exposing the substrate 10 to light using the alignment key patterns of the mask and the substrate will be now explained with reference to FIGS. 4A to 4C as well as FIGS. 2 and 3.

Figure 4A:
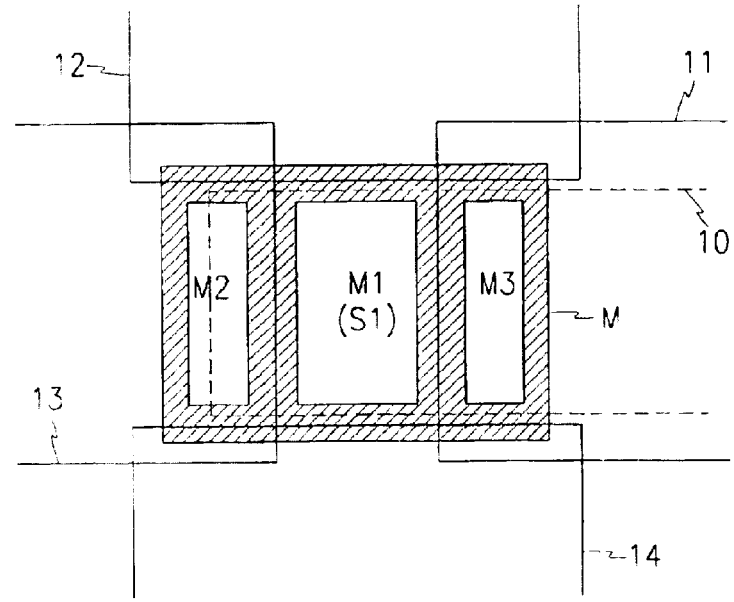
FIGS. 4A to 4C illustrates the steps of exposing the substrate shown in FIG. 3 to light.

First, as shown in FIG. 4A, a first shot is made with respect to the first short region S1 placed at the center portion I of the substrate 10 using the first mask pattern M1.

The mask M is intercepted by masking blades 11 to 14 of the aligner except for the first mask pattern M1, and the mask M and the substrate 10 are aligned with each other through combining the alignment keys ① and ①' of the first mask pattern M1 with the alignment keys ① and ①' formed at one of the sub-regions of the first shot region S1.

Thereafter, shot is made with respect to the substrate 10.

The substrate 10 is then shifted such that it is aligned with the mask M through combining the alignment keys ① and ①' of the first mask pattern M1 with the alignment keys ① and ①' formed at another sub-region of the first shot region S1.

Shot is made with respect to the substrate 10.

In this way, the first shot is made with respect to a plurality of sub-regions of the first shot region S1, thereby performing the light exposing with respect to the center portion I of the substrate 10.

Figure 4B:
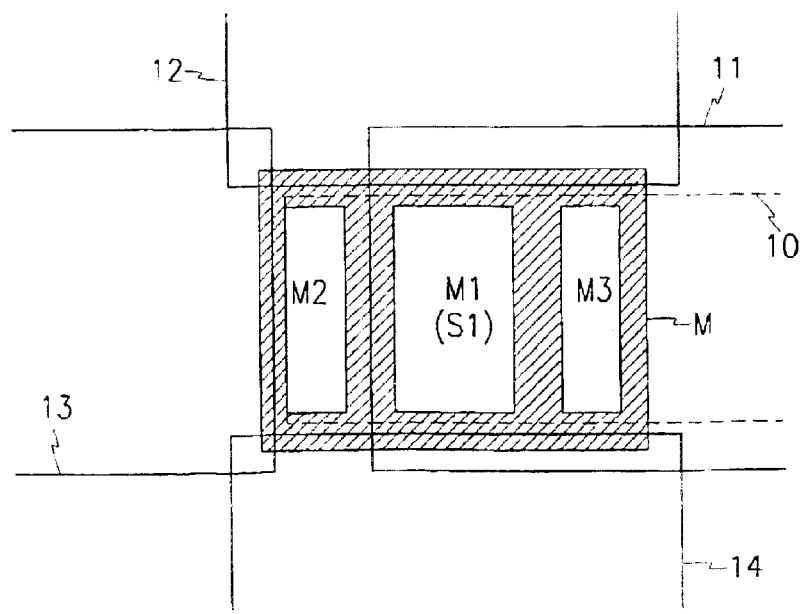

As shown in FIG. 4B, a second shot is made with respect to the second shot region S2 placed at the left portion II of the substrate 10 using the second mask pattern M2.

The mask M and the substrate 10 are aligned with each other through combining the first alignment keys ① and ①' of the first mask pattern M1 with the second alignment keys ② and ②' formed at the left first shot sub-region S1$_L$ of the first shot region S1 directly neighboring to the second shot region S2 of the substrate 10.

As the distance between the first alignment patterns ① and ①' of the mask M and the right side of the second mask pattern M2 is the same as that between the second alignment patterns ② and ②' at the left first shot sub-region S1$_L$ of the substrate 10 and the right side of the second shot region S2, the second mask pattern M2 of the mask M correctly conforms to the second shot region S2 of the substrate 10 except for the double light-exposed portions at the shot boundary area.

The mask M is then intercepted by the masking blades 11 to 14 of the aligner except for the second mask pattern M2, and shot is made with respect to the substrate 10.

Figure 4C:
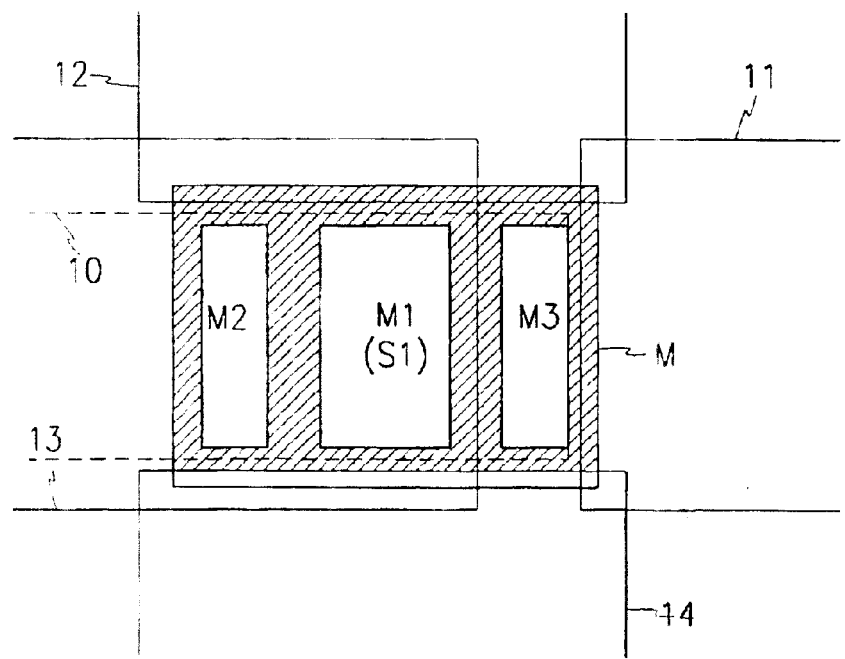

As shown in FIG. 4C, a third shot is made with respect to the third shot region S3 placed at the right portion III of the substrate 10 using the third mask pattern M3.

The mask M and the substrate 10 are aligned with each other through combining the first alignment keys ① and ①' of the first mask pattern M1 with the third alignment keys ③ and ③' formed at the right first shot sub-region S1$_R$ of the first shot region S1 directly neighboring to the third shot region S3 of the substrate 10.

As the distance between the first alignment patterns ① and ①' of the mask M and the left side of the third mask pattern M3 is the same as that between the third alignment patterns ③ and ③' at the right first shot sub-region S1$_R$ of the substrate 10 and the left side of the third shot region 32, the third mask pattern M3 of the mask M correctly conforms to the third shot region of the substrate 10 except for the double light-exposed portions at the shot boundary area.

The mask M is then intercepted by the masking blades 11 to 14 of the aligner except for the third mask pattern M3, and shot is made with respect to the substrate 10.

As described above, first to third mask patterns as well as first to third alignment patterns are formed at one large-sized mask. The distance between the alignment patterns formed at the substrate and the mask is established to conform to the distance between the mask patterns. The alignment patterns are used to make the desired inter-shot alignment at the light exposing. In this way, the stitch failure due to the inter-shot misalignment can be prevented.

While the present invention has been described in detail with reference to the preferred embodiments, those skilled in the art will appreciate that various modifications and substitutions can be made thereto without departing from the spirit and scope of the present invention as set forth in the appended claims.

What is claimed is:

1. A mask for fabricating a liquid crystal display with a substrate the mask comprising:
    a first mask pattern positioned at the center of the substrate with a center line of the mask to expose the center of the substrate to light;
    a second mask pattern positioned to the left of the first mask pattern to expose the left side of the substrate to light, the second mask pattern being spaced apart from the first mask pattern with a first distance; and
    a third mask pattern positioned to the right of the first mask pattern to expose the right side of the substrate to light, the third mask pattern being spaced apart from the first mask pattern with a second distance,
    wherein an area occupied by the first mask pattern is different from an area occupied by the second or third mask patterns, and a shape of the first mask pattern is different from a shape of the second or third mask patterns.

2. The mask of claim 1 wherein alignment keys for the light exposure are formed at the first mask pattern.

3. The mask of claim 2 wherein the alignment keys are formed with a pair of first alignment patterns positioned to the left and to the right of the center line of the mask symmetrical to each other with respect to the center line of the mask, a pair of second alignment patterns positioned to the right of the first alignment patterns while being spaced apart from the first alignment patterns with the first distance, and a pair of third alignment patterns positioned to the left of the first alignment patterns while being spaced apart from the first alignment patterns with the second distance.

4. A method of exposing a substrate for a liquid crystal display to light, the method comprising the steps of:
    preparing a substrate partitioned with a center portion, a left portion and a right portion;
    preparing a mask with first to third mask patterns, the first mask pattern being positioned at the center of the substrate with a center line of the mask to expose the center portion of the substrate to light, the second mask pattern being positioned to the left of the first mask pattern to expose the left side of the substrate to light while being spaced apart from the left side of the first mask pattern with a first distance, the third mask pattern being positioned to the right of the first mask pattern to expose the right side of the substrate to light while being spaced apart from the right side of the first mask pattern with a second distance, wherein an area occupied by the first mask pattern is different from an area occupied by the second or third mask patterns;

aligning the mask and the substrate with each other; and using the mask to separately expose the center portion, the left portion and the right portion of the substrate to light.

5. The method of claim 4 wherein first alignment keys are formed at the first mask pattern of the mask, and second alignment keys are formed at the center portion of the substrate such that the second alignment keys match to the first alignment keys.

6. The method of claim 5 wherein the first alignment keys are formed with a pair of first alignment patterns positioned to the left and to the right of the center line of the mask symmetrical to each other with respect to the center line of the mask, a pair of second alignment patterns positioned to the right of the first alignment patterns while being spaced apart from the first alignment patterns with the first distance, and a pair of third alignment patterns positioned to the left of the first alignment patterns while being spaced apart from the first alignment patterns with the second distance.

7. The method of claim 6 wherein the alignment of the mask with the substrate is made through combining the first alignment keys of the first mask pattern with the second alignment keys of the substrate, and the light exposing with respect to the center portion of the substrate is made using the first mask pattern.

8. The method of claim 7 wherein the light exposing with respect to the substrate using the mask is made while intercepting the mask and the substrate with a light interception member of a light exposing device except for the first mask pattern.

9. The method of claim 6 wherein the alignment of the mask with the substrate is made through combining the first alignment patterns of the first mask pattern with the second alignment patterns of the substrate, and the light exposing with respect to the left portion of the substrate is made using the second mask pattern.

10. The method of claim 9 wherein the light exposing with respect to the substrate using the mask is made while intercepting the mask and the substrate with a light interception member of a light exposing device except for the second mask pattern.

11. The method of claim 6 wherein the alignment of the mask with the substrate is made through combining the first alignment patterns of the first mask pattern with the third alignment patterns of the substrate, and the light exposing with respect to the right portion of the substrate is made using the third mask pattern.

12. The method of claim 11 wherein the light exposing with respect to the substrate using the mask is made while intercepting the mask and the substrate with a light interception member of a light exposing device except for the third mask pattern.

13. A mask for fabricating a liquid crystal display with a substrate, the mask comprising:

a first mask pattern positioned at the center of the substrate with a center line of the mask to expose the center of the substrate to light;

a second mask pattern positioned to the left of the first mask pattern to expose the left side of the substrate to light, the second mask pattern being spaced apart from the first mask pattern with a first distance; and a third mask pattern positioned to the right of the first mask pattern to expose the right side of the substrate to light, the third mask pattern being spaced apart from the first mask pattern with a second distance, wherein alignment keys for the light exposure are formed at the first mask pattern and the alignment keys are formed with a pair of first alignment patterns positioned to the left and to the right of the center line of the mask symmetrical to each other with respect to the center line of the mask, a pair of second alignment patterns positioned to the right of the first alignment patterns while being spaced apart from the first alignment patterns with the first distance, and a pair of third alignment patterns positioned to the left of the first alignment patterns while being spaced apart from the first alignment patterns with the second distance.

14. The mask of claim 13 wherein a shape of the first mask pattern is different from a shape of the second or third mask patterns.

15. The mask of claim 13 wherein an area occupied by the first mask pattern is different from an area occupied by the second or third mask patterns.

\* \* \* \* \*